United States Patent [19]

Zeigler

[11] Patent Number: 4,820,788

[45] Date of Patent: Apr. 11, 1989

[54] POLY(SILYL SILANE)HOMO AND COPOLYMERS

[75] Inventor: John M. Zeigler, 2208 Lester Dr. NE., Albuquerque, N. Mex. 87112

[73] Assignee: John M. Zeigler, Albuquerque, N. Mex.

[21] Appl. No.: 925,552

[22] Filed: Oct. 31, 1986

[51] Int. Cl.$^4$ .............................................. C08G 77/04
[52] U.S. Cl. ...................................... 528/33; 528/10; 528/25; 556/430; 430/72; 430/323
[58] Field of Search ...................... 528/25, 33; 556/430

[56] References Cited

U.S. PATENT DOCUMENTS

| | | | |
|---|---|---|---|
| 2,563,005 | 8/1951 | Clark | 528/43 |
| 4,052,430 | 10/1977 | Yajima et al. | 528/35 |
| 4,464,460 | 8/1984 | Hiraoka et al. | |
| 4,472,591 | 9/1984 | Schilling, Jr. et al. | 528/12 |
| 4,569,953 | 2/1986 | West et al. | |
| 4,587,205 | 5/1986 | Harrah et al. | |
| 4,588,801 | 5/1986 | Harrah et al. | |
| 4,727,170 | 2/1988 | Nagai et al. | 556/430 |

FOREIGN PATENT DOCUMENTS 0251216 1/1988 European Pat. Off. .
63-29760 7/1986 Japan .

OTHER PUBLICATIONS

Chemical Abstracts, 109:101837c;
Chemical Abstracts, 109:191128z.
Chemical Abstracts 109:101837c, *CA Selects: Organosilicon Chemistry*, Issue 19, 1988, pg. 32.
Indriksons et al. JACS 92:22, 11/4/70, 6704.
West et al., JACS 94:17, 8/23/72, 6110.
CA Selects: Organosilicon Chemistry, Issue 21, 1985, pg. 27 #103:132441Z.
Ishikawa and Kumada, M., "Photolysis of Permeated Linear and Branched-chain Polysilanes", 1971, pg. 489 of Chemical Comm.
Ishikawa, Yamakaka et al., "Photolysis of Organopolysilanes, Synthesis and Photochemical . . . ", pp. 167–176, 1985.
Gasper et al., "Laser Photolysis of 2-phenylheptamethyltrisilane" Chemical Physics Letters, vol. 105, No. 2, Mar. 1984, pp. 153–157.
Zeigler, Harrah & Johnson, "Self-developing polysilane deep-UV resists—photochemistry . . . ", SPIE, vol. 539, (1985), pp. 166–174.

*Primary Examiner*—Melvyn I. Marquis
*Attorney, Agent, or Firm*—Millen & White

[57] ABSTRACT

Poly(silyl silanes) have been prepared. They have high photosensitivity and excellent resistance to oxygen-reactive ion etching processes. They are useful as photodepolymerizable photoresists, barrier layers, etc.

31 Claims, No Drawings

POLY(SILYL SILANE)HOMO AND COPOLYMERS

The U.S. Government has rights in this invention pursuant to Contract No. DE-AC04-76DP00789 between the U.S. Department of Energy and AT&T Technologies, Inc.

BACKGROUND OF THE INVENTION

This application relates to a new class of homo and copolymers having properties which make them especially useful as photoresists, especially in view of their very high resistance to oxygen reactive ion etching ($O_2$-RIE).

U.S. Pat. Nos. 4,587,205 and 4,588,801 to Zeigler et al describe polysilane polymers useful as self-developing photoresist materials, as well as methods for their use in microlithography and other high resolution imaging applications. These are the pioneer patents in the polysilane field. A major factor for the high level of interest generated by the inventions of these patents, in addition to their self-developing capabilities, is the very high resistance to $O_2$-RIE of the materials. They etch about 30 times slower than standard positive-working photoresists under the same conditions.

$O_2$-RIE resistance allows the combining in a single layer of these materials of the functions normally provided in two layers in trilayer or, more generally, multilayer lithography. Thus, a single layer of self-developing polysilane can be used to combine the functions of the imaging layer and the etch barrier layer in conventional methods. Trilayer lithography can be converted as a result into bilayer lithography using the potential of the photovolatilizing polysilanes. This simplification allows the numbers of steps necessary to carry out multilayer lithography to be cut essentially in half, with attendant reductions in cost and pollutant emissions and increases in device yield. As the topography of integrated circuits becomes even greater at smaller critical device dimensions, multilayer lithographic schemes become increasingly necessary to print the submicron features present in the state-of-the-art VLSI circuits. Thus, the importance of self-developing polysilanes is proportionately increased.

The smallest feature that can be transferred to, e.g., a silicon wafer by bilayer lithography is closely related to the ratio of the etch rate of underlying planarizing layer to that of the imaging layer; the higher this ratio is, the smaller the feature printed in the imaging layer that can be transferred without unacceptable loss of feature resolution. Even though the polysilanes of the prior art have very high etch rate ratios, materials exhibiting even higher ratios are much desired.

SUMMARY OF THE INVENTION

It is, thus an object of this invention to provide a new class of polymers retaining or surpassing the properties of the known polysilanes and, especially, having high photosensitivity and permitting higher etch rate ratios in bilayer lithography.

Upon further study of the specification and appended claims, further objects and advantages of this invention will become apparent to those skilled in the art.

These objects have been achieved by providing a new class of polymers, i.e., the poly(silyl silanes). These polymers have the structure of polysilanes having a main chain of catenated silicon atoms and pendant side groups, at least one of the latter being a silyl group.

The poly(silyl silanes) of this invention include those of the formula

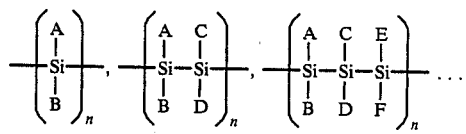

wherein
each of A, B, C, D, E, F, . . . independently is silyl, e.g., organosilyl, poly(silyl, e.g., organosilyl), organo or H, at least one of A and B or A, B, C and D or A, B, C, D, E and F being silyl or polysilyl, e.g., organosilyl or poly(organosilyl).

In another aspect, this invention relates to a method of photopatterning an image onto a substrate coated with a photoresist which is a poly(silyl silane) homo- or copolymer comprising irradiating the coated substrate with actinic radiation forming a pattern of said image on the substrate. As with the polysilanes of U.S. Pat. Nos. 4,587,205 and 4,588,801, the image can be developed in the polymers of this invention without use of a solvent development step. Under appropriate wavelength/fluence conditions, the poly(silyl silanes) of this invention will photodepolymerize and in may cases volatilize upon exposure to actinic radiation.

In yet another aspect, this invention provides, in a method of forming an image in a substrate comprising exposing a coated substrate to oxygen-reactive ion etching wherein the coating on the substrate is at least ternary and comprises a planarizing layer, a barrier layer and a photoresist layer, the improvement wherein said ternary portion is replaced by a binary portion comprising a planarizing layer and a layer of a poly(silyl silane) which serves the function of both said barrier and photoresist layers.

In a further aspect, this invention relates to a process for preparing a poly(silyl silane) precursor $R_1R_2R_3Si$-$SiR_4R_5R_6$ wherein $R_{1-5}$ are aliphatic or aromatic groups, and $R_6$ is an aromatic group, comprising reacting $R_4R_5R_6SiCl$ with an alkali metal, $M^o$, to form $R_4R_5R_6SiM$ and reacting the latter with $ClSi\ R_1R_2R_3$ to form $R_1R_2R_3Si$-$SiR_4R_5R_6$, wherein the latter reaction is carried out in situ with respect to the first step.

Suitable silyl groups within the scope of this invention include all those whereby the corresponding poly(silyl silanes) have utilitarian properties, e.g., as photoresist layers for very high resolution lithography or for very low resolution applications, e.g., wherein decorative patterns are to be incorporated onto or into a surface; as $O_2$-RIE resistant layers for use as simple etch barriers in multilayer lithography; as temporary coating layers for substrates, e.g., for protective purposes, e.g., for transportation in the absence of actinic radiation, followed by coating removal by the convenient depolymerization characteristics of the poly(silyl silanes) of this invention, e.g., upon exposure to actinic radiation; as photoinitiators; as curing agents; as photosensitizers; as highly thermally stable, non-charring encapsulants; as ceramic fiber precursors; as non-linear optical materials; etc. Thus, all inorganic or organic silyl groups providing such polymers are included. Preferably, the silyl substituents are organo, but may also be organosilyl.

Suitable organo groups on the silyl groups or on the main chain of the polysilane portion of the polymers of this invention are also very broad in nature and will also be chosen to provide polymers having utilitarian properties such as those discussed above.

Suitable organo groups include aliphatic and aromatic groups, typically hydrocarbon in nature, non-hydrocarbons also being suitable. The groups may be saturated or unsaturated, substituted or unsubstituted. Typical non-limiting examples of suitable organo groups include $C_{1-15}$-alkyl, $C_2$–$C_7$-alkylene, $C_{3-15}$-cycloalkyl, $C_{6-14}$aryl, $C_{7-20}$-aralkyl or $C_{7-20}$-alkaryl. Organo groups in the side chain silyl groups also include organosilyl and poly(organosilyl). The alkyl portions in each of the organo groups include, as appropriate, methyl, ethyl, n-propyl, i-propyl, n-butyl, i-butyl, sec-butyl, t-butyl, as well as any of the pentyl, hexyl, heptyl, octyl, nonyl, decyl, undecyl, dodecyl, tridecyl, tetradecyl and pentadecyl groups. Suitable aryl portions include phenyl, naphthyl, etc. Suitable cycloalkyl groups include cyclopropyl, cyclobutyl, cyclopentyl, cyclohexyl, cycloheptyl, cyclooctyl, adamantyl, etc. Suitable arylalkyl groups include benzyl, phenethyl, phenylpropyl, etc.; suitable alkaryl groups include tolyl, xylyl, etc. Inorganic groups are also included, e.g., $R_2B$-groups where the R groups are organo groups (e.g., preparable using fully conventional chemistry analogous to the silicon chemistry described below, e.g., that of Scheme 2, e.g., using $Ph_2BCl$, etc.).

The organo groups can also be substituted, e.g., by $C_{1-8}$-alkyl, $C_{1-8}$-alkoxy, $C_{6-10}$-aryl, mono- or di($C_{1-6}$-alkyl)-amino, $C_{2-8}$-alkanoyl or a corresponding ketal, amino, hydroxy, $C_{2-8}$-alkanoyloxy, etc. As with the organo groups per se, the nature of the substituents, if any, will not be critical and will be determined by the polymer properties desired for a particular end use, inter alia. For example, where resistance to oxygen-reactive ion etching is desired, only substituents which provide sufficient etch stability will be used.

Also included within the scope of organo groups of this invention are heterocyclic groups, e.g., aliphatic or aromatic heterocyclic groups of 1-3 fused rings, each containing 4-7 ring atoms, 1-3 of which in each ring are O, N or S or even Si, the remainder being C-atoms. Suitable heterocyclic rings include morpholinyl, piperidinyl, pyridyl, etc. For other suitable hetero groups see, e.g., copending application Ser. No. 910,672, filed Sept. 23, 1986, now U.S. Pat. No. 4,761,464, which is entirely incorporated by reference herein.

Preferred organo groups include methyl, ethyl, n- or i-propyl, t-butyl, cyclohexyl, phenyl, phenyl-$C_{1-3}$-alkyl, or $C_{1-3}$-alkylphenyl.

The most preferred organo group on the silyl groups is methyl, e.g., trimethylsilyl is a preferred silyl group. The silyl groups can also be branched, i.e., substituents on the silyl groups include organo silyl groups or poly(organosilyl) groups. Thus, suitable silyl groups include $Si(R)(SiR_3)_2$, where the R groups are organo groups, most preferably methyl but also other silyl groups.

It is possible for all of A, B, C and D to be silyl or polysilyl groups. However, it is preferred that only one of A and B in homopolymers and only one of A, B, C and D in copolymers be a silyl group. The improvement in photosensitivity and $O_2$-RIE resistance provided by a single silyl substituent in the recurring chain (vis-a-vis prior art polysilanes) is very large. The relative effect of additional silyl groups is not as large and they usually make synthesis more difficult.

For the most important uses of this invention, the poly(silyl silanes) will be essentially oligomer free, e.g., by application of fully conventional fractionation procedures, substantially non-crystalline, homogeneous, soluble, essentially linear, etc. in accordance with the desired use. For the preferred uses of this invention, the polymers will also be substantially not crosslinked, e.g., to facilitate photodepolymerization.

The polymers of this invention typically have values of n of at least 10 or 20, preferably of at least 30, 40, 50, 100, 500, 1000, 10000, etc. The lower value of n will be use-dictated, e.g., to achieve the foregoing properties, e.g., essentially oligomer-free and to provide good film forming ability, etc.

Where a silyl side group comprises oligo- or poly(silyl silane) moieties, the length of the side chain is preferably no more than about one-half the length of the main chain. Longer side chains tend to produce polymer solutions which are highly viscous or even gelatinous and thus which fail to satisfy the stringent requirements of the high resolution photolithographic uses of this invention. Thus, at the lower end of the preferred range of values of n, e.g., typically 25-30, the degree of polymerization in the side chains will not be greater than about 13-15. This side chain length requirement is not as important for the less demanding uses of the poly(silyl silanes), e.g., merely as protective coatings. The upper limit on n is determined only by the particular conditions utilized in the preparative process for a given polymer, e.g., often at very high values of n, a polymerization medium and solutions prepared from the isolated polymers will become too viscous for effective handling. Typically, molecular weights up to 10,000,000 or more can conveniently be prepared and utilized.

As discussed thoroughly in U.S. Pat. Nos. 4,587,205 and 4,588,801, both of which are entirely incorporated by reference herein, where photovolatilization characteristics are desired in a polysilane-type polymer, it is necessary that the polymer have sufficient photosensitivity to form fragments upon exposure to actinic radiation and that these fragments be of sufficiently low molecular weight to be volatile under the irradiation conditions. For the polysilanes of the prior art, this balance necessarily had to be struck rather delicately. A significant advantage of the poly(silyl silanes) of this invention is that the balance is much less critical. The mere existence of pendant silyl groups essentially ensures that the polymer will have the high photosensitivity needed to form fragments upon irradiation. Achievement of the necessarily low fragment weight can routinely be accomplished, perhaps with a few preliminary orientation experiments, for a given polymer system by appropriate choice of organo substituents on the silyl groups. Where the latter are oligo- or poly(silyl) groups, achievement of the necessary low fragment weight will be greatly facilitated by scission in the side chains per se. Moreover, scission of the silyl main chain Si—Si bond will also achieve this function.

In the past, this need for low weight fragments was somewhat inconsistent with the need for bulky side groups which increased photosensitivity. Here, not only are the pendant silyl groups by and large bulky, but, more importantly and surprisingly, they additionally significantly increase the photochemical sensitivity of the polymer, e.g., in comparison with prior art polysilanes. It is believed, without wishing to be bound by theory, that this is a result of their catalysis of intersystem crossing to the photochemically active triplet state.

The preferred use of the poly(silyl silanes) of this invention is in photolithography. Like the prior art polysilanes, the homo- and copolymers of this invention can be used as conventional photoresists, albeit ones having high photosensitivity and excellent resistance to oxygen-reactive ion etching. Thus, they can be photopatterned using actinic radiation fully in accordance with prior art methods. If desired, the photoresists can be developed using solvents which dissolve the exposed portions of the polymer (photodepolymerized and not volatilized) but not the unexposed portions. Typical such solvents include lower alkanols such as isopropyl alcohol, ethyl acetate, up to $C_7$ alkanes and mixtures of these with solvents for the polymers. More often, development will be solvent-free, taking advantage of the photovolatilization phenomenon described in the foregoing references.

Where desired, conventional solvent stripping methods can be utilized to remove the poly(silyl silane) photoresists after the substrate treatment steps. Again, taking maximum advantage of this invention, this stripping step can also be accomplished in solvent-free fashion by simply exposing the entire surface to high flux actinic radiation which will cause the entire remaining amount of poly(silyl silane) to photovolatilize.

The self-developing polysilanes of U.S. Pat. Nos. 4,588,801 and 4,587,205 and Zeigler et al, SPIE, 539, 166 (1985), also incorporated entirely by reference herein, exhibit highly efficient photochemistry despite the fact that their singlet excited states fluoresce in a narrow high quantum yield ($\phi_f=0.45-0.7$) emission characteristic of a delocalized excited state. This phosphorescence, on the other hand, shows strong vibrational coupling, suggestive of a localized excitation, and is of exceedingly low quantum yield ($\phi_p \sim 10^{-4}$). It is thus postulated (without wishing to be bound by theory) that the triplet state is responsible for prior art polysilane solid-state photochemistry. The so-called "heavy atom effect" on intersystem crossing to the triplet manifold, it is believed without wishing to be bound by theory, at least partially causes the poly(silyl silanes) to have much lower fluorescence and increased photosensitivity over the previous materials. It has however been found that the fluorescence of the polymers, e.g., poly(trimethylsilyl methyl silane) is present not as a single band as in the previous polysilanes, but is doubled and has $\phi_f \approx 0.02$ (an approximately 20-30 fold reduction over previous polysilanes). Moreover, a 1:1 copolymer of the trimethylsilyl MeSi subunit with cyclohexyl MeSi is approximately four times as photosensitive in the self-developed mode as (cyclohexyl MeSi)$_n$. This gives an approximate sensitivity of 200 mJ/cm$^2$/1$\mu$ thickness (cf. 150 mJ/cm$^2$/1$\mu$ of standard solvent developed positive resist and about 800 mJ/cm$^2$/1$\mu$ of prior art polysilanes).

Further advantageously, the increased content of silicon atoms in the polymers of this invention causes them to have etch-rate ratios which are significantly higher than those previously available in polysilanes. See, e.g., Taylor et al, Solid State Tech., 145 (2/84). In prior art polysilanes, the highest silicon-content member which is air stable is (Me$_2$Si)$_n$ which, unfortunately, is intractable and cannot be used as a resist. One of the simplest polymers of this invention, poly(trimethylsilyl methyl silane), has the same silicon content as (Me$_2$Si)$_n$ but is fully soluble. In comparison with etch rate ratios of about 30:1 for prior art self-developing polysilanes, etch rate ratios of the polymers of this invention are significantly higher, e.g., 50:1 and more. Because of this property, the polymers of this invention are especially useful as oxygen-reactive ion etch resistant layers. For example, they can be utilized as barrier layers in the conventional oxygen-reactive ion etch processes. More preferably, they can be utilized to serve the function as both the barrier layer and the photoresist layer. In this regard, see U.S. Pat. No. 4,464,460 and JP No. 60,119,550 (Chem. Abstracts 103 132441z (1985), whose disclosures are entirely incorporated by reference herein. Thus, the polymers of this invention will be of wide applicability in all areas where such etching processes are utilized.

In yet another application, the poly(silyl silanes) of this invention can be used as photosensitizers or photoinitiators in mixtures of photopolymerizable vinyl monomers or prepolymers, e.g., in accordance with the details of U.S. Pat. No. 4,569,953, which is entirely incorporated by reference herein.

For all the foregoing uses, the polymers of this invention can be used substantially analogously to the corresponding use of the polysilanes in the past. However, advantage can be taken of the increased photosensitivity of the polymers of this invention, e.g., lower fluxes will be available for photovolatilization modes. The actinic radiation wavelength range is essentially the same as that for prior art polysilanes, i.e., in the ultraviolet wavelength range.

The poly(silyl silanes) of this invention can be prepared using conventional silicon chemistry except as indicated otherwise below.

For example, the following 2-step reaction can be employed as exemplified for Me$_3$Si—MeCl$_2$:

<u>Scheme 1</u>

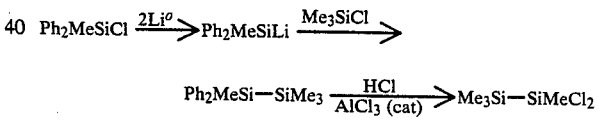

The first two steps as practiced by this invention constitute a considerable process simplification over the prior art in that the coupling of Ph$_2$MeSiCl to form Ph$_2$MeSiSiMePh$_2$ and reductive cleavage to Ph$_2$MeSiLi followed by reaction with trimethylsilylchloride are performed in a 1-pot reaction. The first step is generally conducted at temperatures of $-50°$ to $100°$ C. (preferably 20°-25° C.) for reaction times in the range of about 20 minutes to about 24 hours. Typically, from about 1.7 to about 4 equivalents of lithium (or another alkali metal, e.g., Na$^o$ or K$^o$) are utilized. Suitable solvents include tetrahydrofuran, glyme, ether and other equivalents. This first step typically achieves about a 70% conversion in the presence of stoichiometric lithium.

After completion of the first step an in situ coupling to form the Si—Si bond is achieved simply by titration-like addition of an essentially stoichiometric amount of Me$_3$SiCl. During this reaction, completion can be easily detected by loss of the inherent dark red color of Ph$_2$MeSiLi. The reaction is essentially instantaneous, silane addition typically being completed in less than about an hour. Reaction temperature is non-critical and simply must be less than the boiling point of the silane added and the decomposition point of Ph₂MeSiLi. Typically, the reaction is conducted at 25°-50° C.

Upon completion of the second step, the reaction medium can be stirred in the presence of the excess lithium whereupon the remaining Ph₂MeSi—SiMePh₂ will be converted to the corresponding lithium compound again to an extent of about 70%. The cycle can then be repeated a desired number of times to significantly increase the overall conversion. The final step of the process, cleaveage of the phenyl groups with HCl, is conducted in accordance with the procedures of Ishikawa et al, *J. Organomet. Chem.* 118, 151 (1976), whose disclosure is entirely incorporated by reference herein.

This basic scheme can be used to prepare a wide variety of the monomers needed to prepare the poly(silyl silanes) of this invention. For example, the various methyl groups in the starting materials can be replaced by essentially any of the organo groups mention above except for aryl and substituted aryl groups and other groups which do not survive the Scheme 1 reactions, e.g., bulky groups like t-butyl, groups having O or N bonded directly to Si like alkoxy, morpholine, etc. In cases of doubt, routine preliminary experiments can be performed to determine the suitability of the foregoing reaction chemistry to the preparation of the monomer of interest.

Where the foregoing chemistry is not applicable, other conventional techniques can be utilized. For example, where it is desired to couple a silane having an aryl group to another silane, e.g., SiMe₃Cl, the chemistry of Scheme 2 can be utilized:

Scheme 2

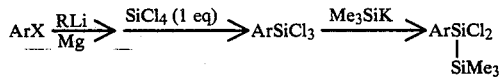

This reaction is also a general one, involving conventional halogen-metal interchange with an appropriate organolithium reagent or, alternatively, conventional Grignard reagent formation from the aryl halide, to prepare the corresponding arylorganometallic compound. The latter can be conventionally reacted with, e.g., tetrachlorosilane to afford ArSiCl₃. Conventional treatment of the latter with a respect such as Me₃SiK yields the desired monomer. Suitable aryl groups include phenyl, naphthyl, substituted aryl and the other aryl moieties mentioned above. X is halo, including Cl, Br, I, F. The coupling step can be achieved with a wide variety of R₃SiK or R₃SiLi reagents to afford a wide variety of aryl-containing monomers.

Similarly, the chemistry of Scheme 2 can also be used where Ar is replaced by another organo group from among those described above. Suitable such groups will include the foregoing organo groups except for those which are incompatible with lithium reagent formation, e.g., ketone functionalities, etc.

Where Ar is replaced by, e.g., n-alkyl, the trichlorosilane (analogous to ArSiCl₃ in the foregoing) can be prepared by conventional hydrosilation of the corresponding alkene, for instance, with HSiCl₃ in the presence of a noble metal catalyst (e.g., chloroplatinic acid) to give, e.g., the corresponding n-alkyl SiCl₃ compound. The trihalosilane can then be converted to the appropriate silylated monomer as shown in Scheme 2. The Grignard or lithium reagent chemistry shown in Scheme 2 in conjunction with aryl groups is preferred where branched alkyl groups are involved.

The foregoing chemistry can be combined in many self-evident ways to prepare a wide variety of the monomers necessary to prepare desired poly(silyl silanes).

Where the side chains involve silyl groups having more than one silicon atom, other conventional chemistry can be utilized. For example, where the number of silicon atoms in the side group is 3-7, the chemistry of Scheme 3 will be appropriate:

Scheme 3

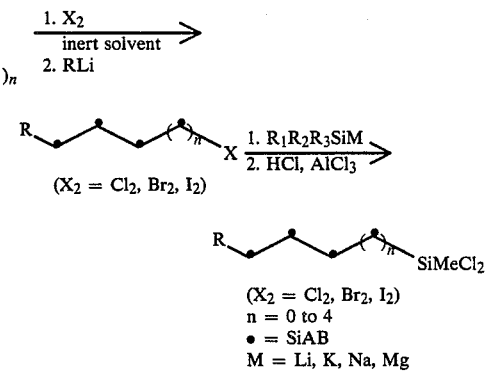

(X₂ = Cl₂, Br₂, I₂)
n = 0 to 4
● = SiAB
M = Li, K, Na, Mg

The ring compounds shown as starting materials are commercially available or otherwise readily available by conventional coupling of dihalosilanes using lithium or magnesium. (In the latter reactions, the resultant predominant ring size varies with the nature of the substituent, bulky substituents tending to give smaller rings preferentially.) The ring opening reaction shown above to prepare the α,ω-dihalooligosilane is a very facile one. It can be performed in the same pot as the subsequent reaction with RLi to give the corresponding 1-halooligosilane. Reaction of the latter with R₁R₂R₃SiM, e.g., MePh₂SiLi as described above, followed by cleavage of the phenyl groups with HCl/AlCl₃, can be used to attach the oligosilyl group to a wide variety of SiR₃ groups as described above. R₁, R₂, R₃ are organo groups discussed above, at least one being cleavable, e.g., phenyl, alkoxy, etc., as described above. Similarly, other known coupling reactions (described in the literature or herein) can be utilized to form the desired monomer.

Larger oligosilane side groups can be prepared, e.g., using the chemistry of Scheme 4:

Scheme 4

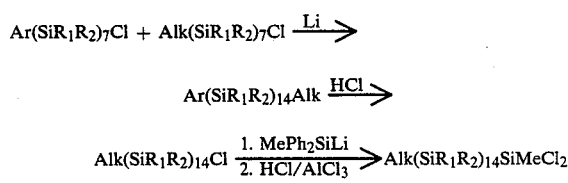

In essence, the methodology involves the dimerization, oligomerization, or even polymerization of the multiple Si-containing silanes discussed above (where R₁ and R₂ are organo as described herein), e.g., using methods analogous to those of Boberski et al, *J. Organomet. Chem.* 88, 65 (1975), which disclosure is entirely incorporated by reference herein. For example, as shown above, to obtain a $Si_{14}$ side chain a 1-halo-7-aryl-heptasilane produced, e.g., in accordance with Scheme 3 above, where R is aryl, can be reductively coupled with a 1-halo-7-alkyl-heptasilane using lithium or sodium metal. Extrapolations to other combinations are apparent. The coupling product is then treated with HCl to give a corresponding 1-chloro-tetradecasilane. The latter is then utilized in the chemistry of Scheme 3 (or Scheme 1) to afford, ultimately, the desired 1,3-dichloro-pentadecasilane.

Side chains having two or three silicon atoms can be prepared using disilane or trisilane monomers which are commercially available or which can fully conventionally be prepared using coupling reactions such as those described above.

In general, details of all of the mentioned conventional reactions will be routinely chosen in accordance with conventional considerations, perhaps in conjunction with a few routine preliminary experiments, and with reference to well known publications in the field, e.g., *Organosilicon Compounds*, Victor Bezant et al, Academic Press, N.Y. (1965); I. Fleming, "Organic Silicon Chemistry", *Comprehensive Organic Chemistry*, Ch. 13, Vol. 2, Pergamon (1979); E. Hengge, *Topics in Current Chemistry*, Vol. 51, Springer Verlag, Berlin (1974), all of whose disclosures are entirely incorporated by reference herein.

Once the monomers are obtained, they can be polymerized to afford the desired poly(silyl silane) using fully conventional reaction chemistry described in the various references cited and/or incorporated by reference above by the procedures described in U.S. Ser. No. 851,713 of Apr. 13, 1986. The primary polymerization technique is reductive coupling using sodium metal. As usual, the monomers and solvents utilized in this reaction must be rigorously pure in order to achieve the most useful molecular weights and yield. Thus, they must be essentially free of typical impurities such as siloxanes, trichlorosilanes, HCl, etc. The necessary purities are available commercially where the corresponding reagent is available commercially. The necessary purities can be routinely achieved applying conventional purification procedures where necessary.

The most preferred methods for preparing the polymers of this invention are those utilizing the optimum solvent mixtures arrived at by procedures in accordance with U.S. patent application No. 851,713, filed Apr. 13, 1986, whose disclosure is entirely incorporated by reference herein. In this regard, for synthesis of the poly(silyl silanes) of this invention, it has been found to be advantageous to use slower sodium dispersion addition rates than those described in the mentioned application, e.g., rates which are considerably less than those normally employed for preparation of the conventional polysilanes, e.g., 10–100 meq/min versus 320 meq/min.

The poly(silyl silane) homo and copolymers of this invention are soluble in a wide variety of non-polar solvents, (e.g., toluene, xylene, heptane, decane, tetrahydrofuran, etc.). Films can be cast from the corresponding solutions. Solvent casting, spin casting, dipping, spraying, etc., are all applicable film-forming techniques. A wide variety of substrates can be coated with the poly(silyl silanes) of this invention, e.g., all of those useful in conjunction with the prior art polysilanes. Good adhesion is observed. Of course, substrates useful in microelectronic design are especially preferred, e.g., silicon, aluminum, semiconductors, quartz, sapphire, etc.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the preceding text and the following examples, all temperatures are set forth uncorrected in degrees Celsius and all parts and percentages are by weight; unless otherwise indicated.

EXAMPLE 1

Synthesis of $Ph_2MeSi-SiMe_3$

A slurry 89.3 g of Li metal cut into small pieces in 1500 ml dry tetrahydrofuran (THF) under an Ar atmosphere was treated dropwise with neat $Ph_2MeSiCl$ (1302.2 g, 5.59 moles). During the addition, agitation was provided via a mechanical stirrer and an ice bath was employed as necessary to hold the reaction temperature under 40° C. The mixture was then allowed to stir overnight (16 hr.) at room temperature. The dark red solution of $Ph_2MeSiLi$ was then treated with 607.7 g (5.59 moles) of $Me_3SiCl$ dissolved in 700 ml dry THF. Again an ice bath was utilized to maintain the reaction mixture temperature under 40° C. Near the end of the $Me_3SiCl$ addition, the red color of $Ph_2MeSiLi$ was completely discharged. Upon completion of the addition, the now essentially colorless mixture was filtered to remove precipitated LiCl and unreacted Li metal. Solvent was removed from the resulting clear solution at reduced pressure and the residual oil fractionally distilled at 0.3 mm Hg to afford 1074.1 g of title compound (71%), bp 108°–110° C.

EXAMPLE 2

Synthesis of $Me_3Si-SiMeCl_2$ $Ph_2MeSi-SiMe_3$ (1074.1 g) prepared as in Example 1 was reacted in dry benzene solution with gaseous HCl in the presence of 6 g anhydrous $AlCl_3$ catalyst essentially according to the procedure of Ishikawa et al (*J. Organomet. Chem.*, 118, 151 (1976)). Distillation of the crude product as 80 mm Hg afforded 473.5 g (64%) of product, bp. 78° C.

EXAMPLE 3

Preparation of $(TrimethylsilylMeSi)_n$

A solution of 4.9 g (26.2 mmole) of $Me_3Si-SiMeCl_2$ in a mixture of 65 ml dry toluene and 35 ml dry heptane was heated to reflux and 3.31 g of 40% Na dispersion in mineral spirits added at a rate of 80 meq/min. The dark blue reaction mixture was heated at reflux for 1 hour after completion of the addition, then allowed to cool to room temperature. It was quenched by addition of about 5 ml methanol followed by 100 ml of saturated aqueous $NaHCO_3$ solution. The colorless reaction mixture thus obtained was filtered through diatomaceous earth and the organic phase separated. This was then stripped of solvent and the oily product treated with 50 ml ethyl acetate to precipitate the polymer. After further precipitations from toluene solution with ethyl acetate and tetrahydrofuran solution with methanol, 40 mg of the title polymer was obtained. Size exclusion chromatography gave an $\overline{M}_w$ of 359000 for this material (relative to polystyrene standards). IR (KBr wafer) (cm$^{-1}$): 1260(Si—Me), 1250—(Si—Me$_3$), 845(Si—Me$_3$), 758(Si—Me$_3$), 785(Si—Me).

EXAMPLE 4

Preparation of (Me$_3$Si—SiMe/PhMeSi)$_n$

A mixture of 10.21 g (53.4 mmol) PhMeSiCl$_2$ and 10 g Me$_3$Si—SiMeCl$_2$ (53.4 mmol) was polymerized in a mixed solvent composed of 54 ml toluene and 46 ml heptane in a manner exactly analogous to that used in Example 3. After workup as in Example 3 and precipitations using hexanes in place of the ethyl acetate used in the previous example, 0.54 g of the title copolymer was isolated. An $\overline{M}_w$ of 160000 was found by size exclusion chromatography (relative to polystyrene standards). IR (KBr wafer): 1440 (Si—Ph), 1260 (Si—Me), 1250 (Si—Me$_3$), 845 (SiMe$_3$), 835 (Ph—H bend), 625 (Ph—H bend). $^1$H NMR (CDCl$_3$) ($\delta$): $-0.5$ (br. s., Si—CH$_3$), 7.1 (br. s., Si—Ph). Integration of the Si—Ph absorption relative to the Si—CH$_3$ absorption indicated a 65:35 ratio of PhMeSi to Me$_3$Si—SiMe subunits, respectively.

EXAMPLE 5

Preparation of (Cyclohexyl MeSi/Me$_3$Si—SiMe)$_n$

A refluxing solution of 154 g (0.781 mol) cyclohexylmethyldichlorosilane and 146.2 g (0.781 mol) 1,1-dichlorotetramethyldisilane in a mixture of 396 ml toluene and 504 ml heptane was reacted with 263.3 g of 30% Na dispersion in toluene added at the most rapid rate allowed by the exothermic reaction. The resulting mixture was allowed to reflux for 50 min after completion of the addition, then allowed to cool for 16 hours to ambient temperature. After workup and purification identical to that used in Example 1, 2.17 g of the title polymer was obtained having $\overline{M}_w$ of 164000 by SEC. IR (KBr) (cm$^{-1}$): 1260 (SiMe$_3$), 1250 (Si—Me), 1040 (CH$_2$ bend), 2915 (C—H stretch). $^1$H NMR (CDCl$_3$): $\delta$0.2 (br.m., Si—CH$_3$), 1.3 (br.s., cyclohexyl H), 2.3 (br.s., cyclohexyl H).

EXAMPLE 6

Preparation of (n-Propyl MeSi/Me$_3$Si—SiMe)$_n$ by "Normal" Addition Mode

A slurry of 33.8 g 40% Na dispersion in mineral oil in a refluxing mixture of 4 ml toluene and 42 mol heptane was reacted dropwise at 320 meq/min with a 50% v/v solution of 25 g (133.5 mmol) of Me$_3$Si—SiMeCl$_2$ and 21.0 g of n-propylmethyldichlorosilane in the same solvent mixture. The reaction was completed as in Example 5 and the product polymer isolated in the same fashion to afford 1.41 g of the title polymer as a rubbery solid. A molecular weight, $\overline{M}_w$, of 19000 was found by SEC relative to polystyrene standards.

EXAMPLE 7

Preparation of (Me$_2$Si/Me$_3$Si—SiMe)$_n$

A solution of 6.20 g (48.1 mmol) dimethyldichlorosilane and 9.0 g (48.1 mmol) 1,1-dichlorotetramethyldisilane were reacted with 12.16 g 40% Na dispersion in light oil in a mixture of 69 ml n-decane and 31 ml toluene as in Example 3. After an identical workup and product purification procedure, 120 mg of pure white solid title polymer was obtained. The $\overline{M}_w$ of this material was 33000. Infrared and H NMR spectroscopic data consistent with the assigned structure were obtained.

EXAMPLE 8

Preparation of (Isopropyl MeSi/Me$_3$Si—SiMe)$_n$

A mixture of 4.2 g (26.7 mmol) isopropylmethyldichlorosilane and 5 g (26.7 mmol) of 1,1-dichlorotetramethyldisilane were reacted with Na dispersion (6.75 g of 40% Na in light oil) in a reaction solvent of 50 ml toluene and 50 ml decane according to the procedure given in Example 3. 28 mg of pure white polymer with $\overline{M}_w=65000$ were obtained. IR (KBr wafer) (cm$^{-1}$): 1385, 1368(C—(CH$_3$)$_2$), 1250 (Si—Me$_3$), 750 (Si—Me$_3$), 779 (Si—Me$_3$).

EXAMPLE 9

Analogously to Example 3, using the corresponding monomers and using solvent systems calculated in accordance with U.S. Ser. No. 851,713 of Apr. 13, 1986, the following copolymers are prepared having the recurring unit —Si(A)(B)Si(C)(D)—, wherein A and C are methyl, and for each of B=cyclohexyl, t-butyl, i-propyl or n-propyl, D=trimethylsilyl, triphenylsilyl or triethylsilyl.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. In a linear polysilane having a main chain of at least ten catenated Si atoms and pendant side groups, the improvement wherein at least one side group is a silyl group.

2. A linear poly(silyl silane) having at least ten recurring units.

3. A poly(silyl silane) of claim 2 of the formula

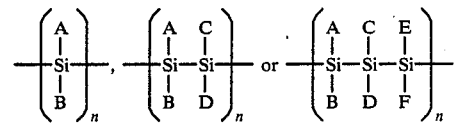

wherein
each of A, B, C, D, E and F independently is organosilyl, poly(organosilyl), organo or H,
at least one of A, B, C, D, E and F being organosilyl or poly(organosilyl).

4. A polymer of claim 3 of the formula

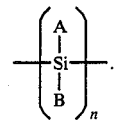

5. A polymer of claim 3 of the formula

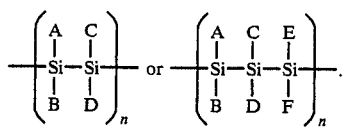

6. A polymer of claim 3, wherein the chain length of side chain poly(organosilyl) groups is up to about one-half the chain length of the main chain.

7. A polymer of claim 3, wherein none of A, B, C, D, E and F is H.

8. A polymer of claim 3, wherein all of A, B, C, D, E and F are organosilyl or poly(organosilyl).

9. A polymer of claim 3, wherein only one of A, B, C, D, E and F is silyl or poly(organosilyl).

10. A polymer of claim 3, wherein at least two of A, C and E are silyl or poly(organosilyl).

11. A polymer of claim 3, wherein the organo portions are aliphatic or aromatic groups wherein said polymer is resistive to oxygen-reactive ion etching.

12. A polymer of claim 3, wherein the organo groups are $C_{1-15}$-alkyl, $C_{3-15}$-cycloalkyl, $C_{6-14}$-aryl, $C_{7-20}$-aralkyl or $C_{7-20}$-alkaryl and those in the side chain silyl groups can also be organosilyl or poly(organosilyl) and n is at least 30, or $C_{2-7}$-alkylene.

13. A polymer of claim 7, wherein the organo groups are $C_{1-15}$-alkyl, $C_{3-15}$-cycloalkyl, $C_{6-14}$-aryl, $C_{7-20}$-aralkyl or $C_{7-20}$-alkaryl and those in the side chain silyl groups can also be organosilyl or poly(organosilyl) and n is at least 30, or $C_{2-7}$-alkylene.

14. A polymer of claim 13, wherein the organic portions are methyl, ethyl, n- or i-propyl, t-butyl, cyclohexyl, phenyl, phenyl-$C_{1-3}$-alkyl or $C_{1-3}$-alkylphenyl.

15. A polymer of claim 13, wherein the silyl groups are trimethylsilyl groups.

16. A polymer of claim 13, wherein said organo groups are substituted by $C_{1-8}$-alkyl, $C_{1-8}$-alkoxy, $C_{6-10}$-aryl, mono- or di($C_{1-6}$-alkyl)-amino, $C_{2-8}$-alkanoyl, amino, hydroxy or $C_{2-8}$-alkanoyloxy.

17. A polymer of claim 14, wherein only one side group of the polymer's repeating unit is silyl.

18. A polymer of claim 16, wherein only one side group of the polymer's repeating unit is silyl.

19. A copoly(silyl silane) of claim 3 of the formula

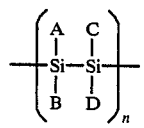

wherein B and D are methyl and A and C are cyclohexyl/trimethylsilyl, t-butyl/trimethysilyl, i-propyl/trimethylsilyl or n-propyl/trimethylsilyl and n is at least 30.

20. A copoly(silyl silane) of claim 3 of the formula

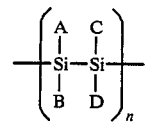

wherein B and D are methyl and A and C are cyclohexyl/triphenylsilyl, t-butyl/triphenylsilyl, i-propyl/triphenylsilyl or n-propyl/triphenylsilyl and n is at least 30.

21. A copoly(silyl silane) of claim 3 of the formula

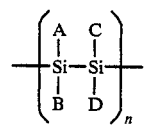

wherein B and D are methyl and A and C are cyclohexyl/triethylsilyl, t-butyl/triethylsilyl, i-propyl/triethylsilyl or n-propyl/triethylsilyl and n is at least 30.

22. A poly(silylsilane) of claim 2 in isolated form.

23. A poly(silylsilane) of claim 2 which is essentially oligomer-free.

24. A poly(silylsilane) of claim 2 which is substantially non-crystalline.

25. A poly(silylsilane) of claim 2 which is soluble in non-polar solvents.

26. A poly(silylsilane) of claim 2 which is substantially not crosslinked.

27. A poly(silylsilane) of claim 2 wherein n is at least 500.

28. A poly(silylsilane) of claim 2 wherein n is at least 1,000.

29. In a solid, linear polysilane having a main chain of at least ten catenated Si atoms and pendant side groups, the improvement wherein at least one side group is a silyl group.

30. A solid, linear poly(silyl silane) having at least ten recurring units.

31. A solid, linear poly(silyl silane) of claim 30 of the formula

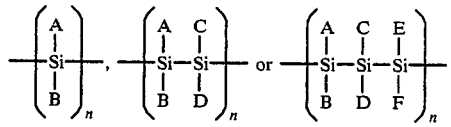

wherein
each of A, B, C, D, E and F independently is organosilyl, poly(organosilyl), organo or H,
at least one of A, B, C, D, E and F being organosilyl or poly(organosilyl),
and n is at least 10.

* * * * *